United States Patent [19]
Vikram

[11] Patent Number: 5,969,293
[45] Date of Patent: Oct. 19, 1999

[54] METHOD AND APPARATUS FOR DOUBLING BACK SINGLE GAUGE LEAD FRAME

[75] Inventor: Seshadri Vikram, Santa Clara, Calif.

[73] Assignee: National Semiconductor Corporation, Santa Clara, Calif.

[21] Appl. No.: 08/896,403

[22] Filed: Jul. 18, 1997

[51] Int. Cl.$^6$ ................................................. H01L 23/02
[52] U.S. Cl. ..................... 174/52.4; 174/52.2; 257/676
[58] Field of Search ..................................... 257/676, 666, 257/669, 670, 675; 174/52.4, 52.2; 361/772, 773

[56] References Cited

U.S. PATENT DOCUMENTS

| | | | |
|---|---|---|---|
| 4,633,582 | 1/1987 | Ching et al. | 29/827 |
| 4,791,473 | 12/1988 | Phy | 257/691 |
| 4,809,054 | 2/1989 | Waldner | 257/667 |

Primary Examiner—Kristine Kincaid
Assistant Examiner—Hung V Ngo
Attorney, Agent, or Firm—Beyer & Weaver, LLP

[57] ABSTRACT

A single gauge lead frame having a second support pad which is substantially a mirror image of a first support pad is disclosed. The second support pad is capable of being placed upon the first support pad. In this manner, the structural and thermally conductive advantages of a dual gauge lead frame is realized at a cost near a single gauge lead frame.

11 Claims, 6 Drawing Sheets

METHOD AND APPARATUS FOR DOUBLING BACK SINGLE GAUGE LEAD FRAME

BACKGROUND OF THE INVENTION

Semiconductor dies are created from a silicon wafer through the employment of various etching, doping, and depositing steps that are well known in the art. Ultimately, the semiconductor die may be packaged by forming an encapsulant around the semiconductor die so as to form an "integrated circuit package" having a variety of pinouts or mounting and interconnection schemes. Plastic is often utilized as an encapsulant. Integrated circuit packages that utilize plastic as an encapsulant are generally less expensive then other packaging options.

Prior to encapsulation, a semiconductor die is mounted upon what is known in the art as a lead frame. The lead frame provides mechanical support of the semiconductor die during the encapsulation procedure. In addition to providing mechanical support to the semiconductor die, the lead frame provides electrically conductive paths (known in the art as leads) between the semiconductor die and external circuitry. The lead frame also enables the semiconductor die to transfer excess thermal energy during operation to an external heat sink.

Poor heat transfer between a packaged semiconductor die and an external heat sink typically results in high die operating temperatures. High die temperatures may result in unacceptable performance degradation or reliability problems. Therefore, it is essential for the lead frame encapsulated within materials such as plastic with low thermal coefficients to provide an thermal path between the semiconductor die and an external heat sink.

As is known in the art, the ability of a material to conduct thermal energy is directly proportional to the cross sectional area of the material in the direction of desired heat flow. To optimize the heat transfer from an attached semiconductor die to an external heat sink, dual gauge lead frames were developed. The term dual gauge refers to the fact that the support pad, or other structure which the semiconductor die is attached, is thicker then the portion of the lead frame blank used for forming the electrical leads. Since the electrical leads are effectively thermally isolated from the die (since the only connections are by way of the bonding wires which may be typically only one or two mils in diameter) the only effective thermal path to an external heat sink is typically through the support pad by way of the die attach area. In order to manufacture a dual gauge lead frame, a dual gauge lead frame blank was used wherein the portion of the blank used to fabricate the support pad was substantially thicker then the portion used to fabricate the electrical leads. In this manner, the necessary heat transfer capacity is realized but at a significantly higher manufacturing cost.

By way of example, FIG. 1A is an illustration of a singular portion 100 of a stamped lead frame strip (not shown) which includes a stamped lead frame assembly 120 and a lead frame body 110. The lead frame body 110 provides mechanical support to lead frame assembly 120 during the encapsulation process. Lead frame assembly 120 generally includes a plurality of electrically conductive leads 170, a support pad 130, which may be downset relative to the leads 170, and a die attach area 140. Support pad 130 further includes a support hole 150 and support arms 144, 145, 146, and 147. Support hole 150 provides a convenient way of supporting lead frame assembly 120 during the encapsulation process. Support arms 144 through 147 provide mechanical support for support pad 130 during the downsetting and subsequent encapsulation process.

FIG. 1B is a cross sectional view of a dual gauge lead frame assembly 120 and mounted semiconductor die 180 as shown in FIG. 1A encapsulated to form a semiconductor die package 300. Using lead frame assembly 120, an integrated circuit die 180 has been physically mounted on die attach area 140 which is in thermal contact with support pad 130. As discussed above, support pad 130 acts as a thermal conduit through which die 180 transfers excess generated heat Q to an external heat seat. In this manner, die 180 is capable of operating within an acceptable temperature range.

A major disadvantage to the use dual gauge lead frames is the added expense of producing dual gauge lead frame blanks. The added expense of manufacture associated with dual gauge lead frame has encouraged the use of single gauge lead frames. Single gauge lead frames, which as the name suggests, are lead frames formed in a the same manner as dual gauge except the initial lead frame blank is of substantially uniform thickness. The advantage with the single gauge lead frame is the lower cost of producing a single thickness lead blank. However, one important disadvantage of the single gauge lead frame is the fact that the support pad cannot provide adequate heat transfer for higher power semiconductor dies. Another disadvantage is the poor mechanical support provided the attached die during the encapsulation process due to the thin support pad.

Thus, there is a need for a lead frame which: 1) provides the added thermal transfer capability of dual gauge lead frames, 2) has the mechanical support afforded by dual gauge, and yet 3) has the ease of manufacture and lower cost as a single gauge lead frame.

The invention provides a lead frame which has the desirable heat transfer characteristics as well as the improved structural support of a dual gauge lead frame yet is close to the manufacturing cost of a single gauge lead frame.

SUMMARY OF THE INVENTION

Broadly speaking, a single gauge lead frame for use in manufacturing of semiconductor die packages capable of realizing benefits associated with dual gauge lead frames is disclosed. In a described embodiment, the single gauge lead frame has a first and a second support pad. The second support pad is attached to the first support pad and is substantially a mirror image of and integrally formed with the first support pad. In the described embodiment, the second support pad is capable of being bent back upon the first support pad to form a double thick support pad. In this manner, the double thick support pad provides the structural and thermally conductive advantages of a dual gauge lead frame at a cost near to a single gauge lead frame.

In another aspect of the present invention, a packaged semiconductor device is set forth. The packaged semiconductor device includes the lead frame as described above, a die having a plurality of bond pads attached to the die attach area, a plurality of bonding wires electrically connecting associated ones of the bond pads to associated ones of the leads. The semiconductor package also includes an encapsulating material that encapsulates a portion of the packaged semiconductor leaving exposed a portion of the leads to facilitate electrical connection to external circuitry as well as a portion of the support pad to facilitate connection of the semiconductor device to an external heat sink In yet another aspect of the present invention, a process for making a lead frame having a second support pad is disclosed. The process includes forming a plurality of leads, a first support pad and a second support pad from a single gauge lead frame blank; the second support pad is integrally attached to and is a mirror image of the first support pad. The first support pad includes a die attach area.

In still another aspect of the present invention, a process for making a packaged semiconductor device with the single gauge lead frame as described above is set forth. The process includes the following operations. First, forming a single gauge lead frame as described above, then attaching a semiconductor device to a die attach area and electrically connecting a multiplicity of bond wires to associated bond pads. The connecting is followed by encapsulating the die and a substantial portion of leads and the double thick support pad in encapsulating material. In this manner, leaving exposed a portion of the leads to facilitate electrical connection to external circuitry and a portion of the double thick support pad to facilitate connection of the encapsulated die to an external heat sink.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Broadly speaking, a single gauge lead frame for use in manufacturing of semiconductor die packages capable of realizing benefits associated with dual gauge lead frames is disclosed. In the described embodiment, the single gauge lead frame includes a first support pad and a die attach area. The lead frame also includes a second support pad that is substantially a mirror image of the first support pad. The second support pad is integrally formed with and attached to the first support pad. During lead frame manufacture the second support pad is bent back, or placed, upon the first support pad to form a double thick support pad. This double thick support pad is provides thermal transfer capacity and mechanical support substantially similar to that provided by the support pad of a dual gauge lead frame. In this manner, the present invention is capable of providing the advantages of a dual gauge lead frame without the added cost of manufacture caused by the complexity of fabricating dual gauge lead frames from dual gauge, or thickness, lead frame blanks. A method for producing a lead frame and a semiconductor package is also described.

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
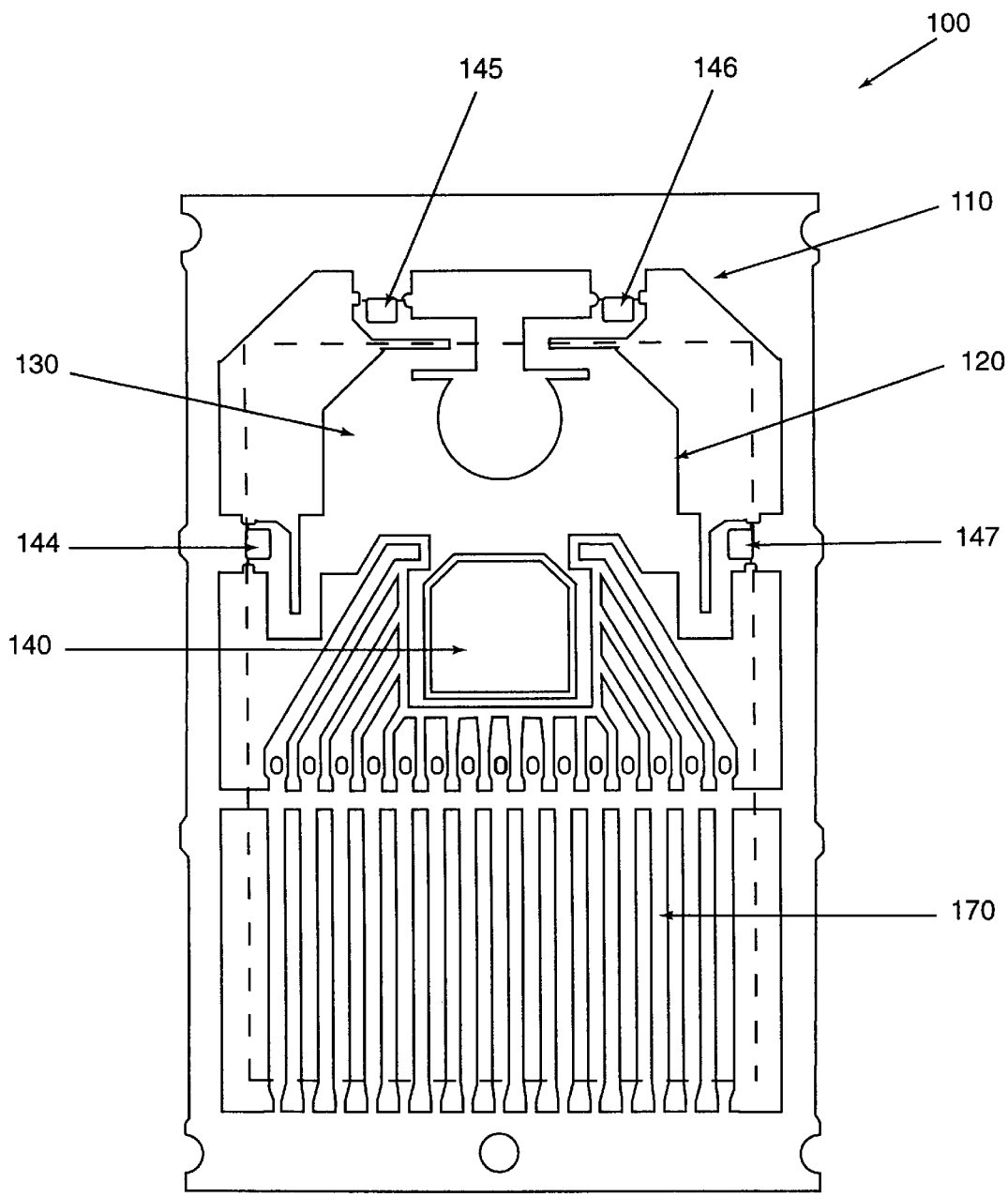
FIG. 1A is an illustration of a portion of a lead frame strip (not shown) which includes a recently developed lead frame assembly and a lead frame body.
Figure 1B:
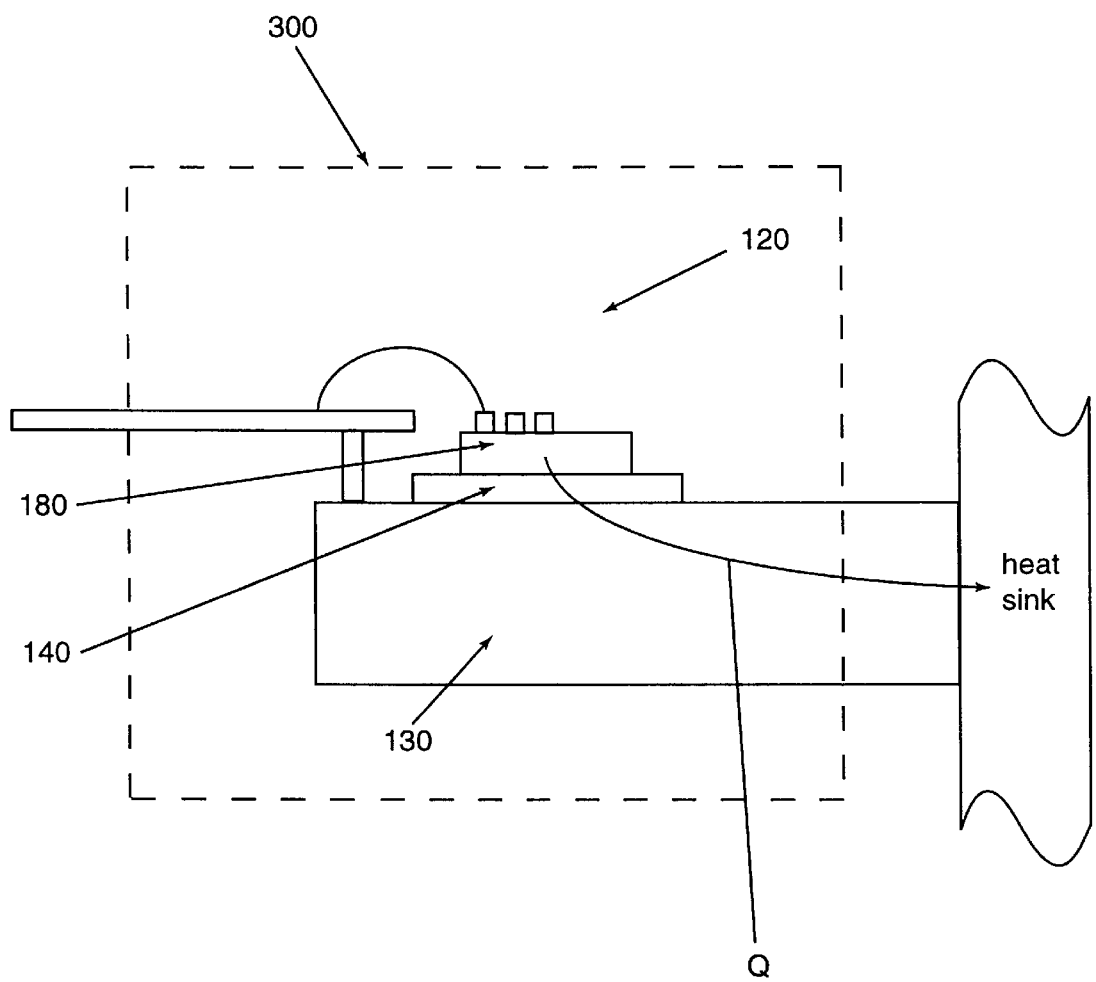
FIG. 1B is a cross sectional view of a recently developed dual gauge lead frame assembly mounted semiconductor die as shown in FIG. 1A subsequent to being encapsulated to form a semiconductor die package.
Figure 2A:
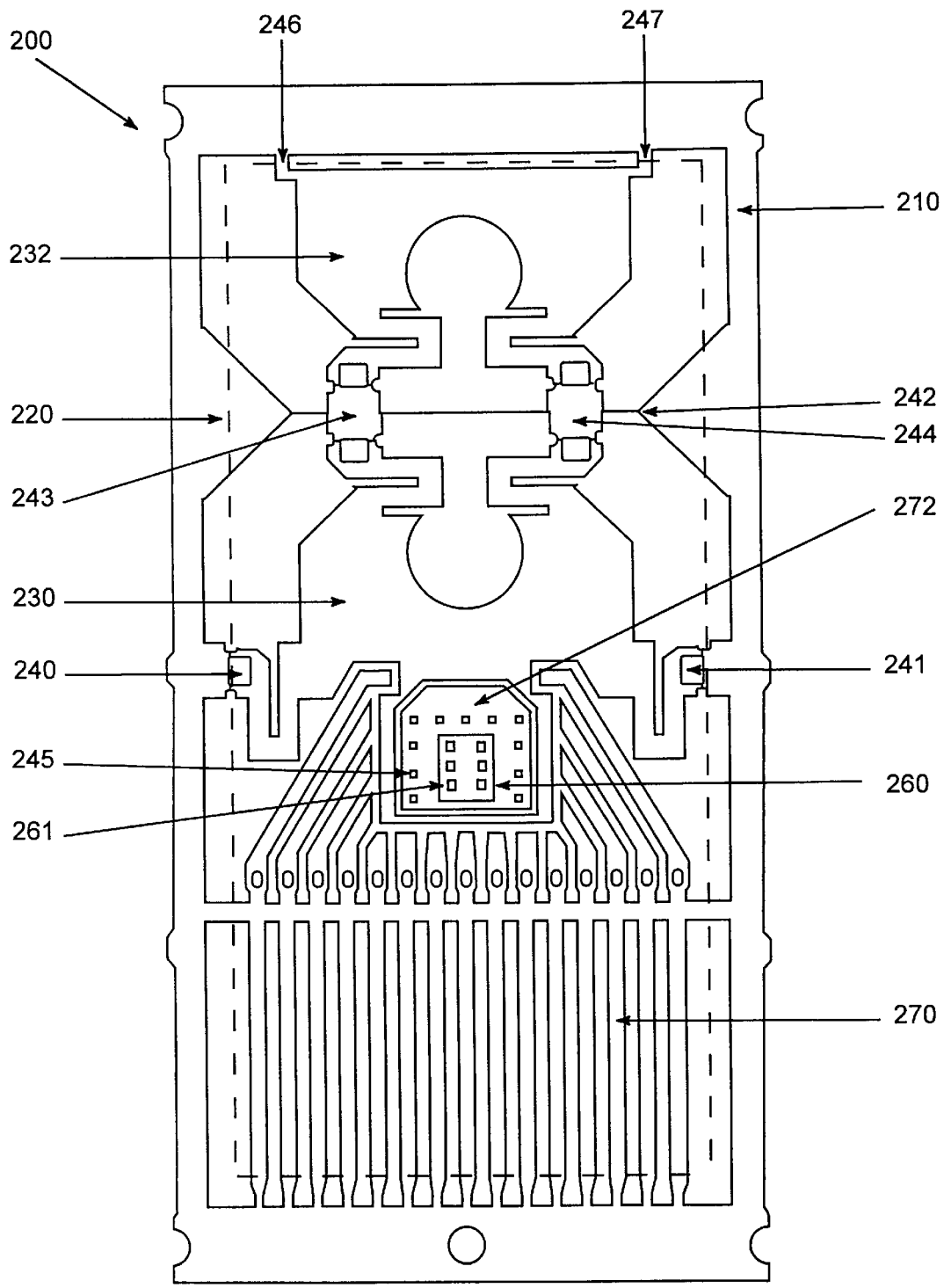
FIG. 2A is a top view of a single gauge lead frame incorporating a second support pad in accordance with an embodiment of the invention.

As discussed above, lead frames are typically formed from metal strips. FIG. 2A illustrates a lead frame assembly 220 before it is separated from the strip. Lead frame assembly 220 is enclosed within and supported by a lead frame body 210 which is part of the lead frame metal strip from which the lead frame is created. The embodiment of the lead frame 200 that is shown is designed for employment with an overmolded integrated circuit package. As shown, the lead frame assembly 220 includes a first support pad 230, a second support pad 232, a plurality of leads 270, and a die attach area 272.

In this embodiment, first support pad 230 further includes a first support notch 250 and support arms 240 and 241 which provide mechanical support of support pad 230. Second support pad 232 further includes a support notch 252 and support arms 246 and 247 which provide mechanical support of second support pad 232. In the described embodiment, support pad 230 and support pad 232 are substantially mirror images of one another as reflected along a line 242. In this manner, when support pad 232 is folded along line 242 and bent back onto first support pad 230, support notches 250 and 252 are aligned. The alignment of support notches 250 and 252 creates a single support hole 256 shown in FIG. 2B when support pad 232 is bent back or placed upon support pad 230. During the encapsulating process, a support post (not shown) may be inserted through the support hole 256 to mechanically supporting lead frame assembly 220.

In another embodiment, second support pad 232 may include a second die attach area. This second die attach area may be used to further increase the heat transfer capacity of the double thick support pad by providing a double thick die attach area. In yet another embodiment, the second support pad 232 may extend to any suitable size.

In the described embodiment illustrated in FIG. 2A, first support pad 230 and second support pad 232 are integrally attached by alignment tabs 243 and 244. Alignment tabs 243 and 244 are substantially mirror symmetric about line 242. In this manner, alignment tabs 243 and 244 may provide a convenient way to bend back support pad 232 upon support pad 230 and still maintain proper alignment. In another embodiment, alignment tabs 243 and 244 may be replaced by a substantially continuous strip conjoining support pads 230 and 232. In yet another embodiment, connecting support pads 230 and 232 may be connected by any methods known to those skilled in the art that allows support pad 232 to be bent back or placed upon support pad 230 and still maintain proper alignment during the bending back or placing operation.

In the described embodiment, die attach area 272 may include a multiplicity of regularly spaced dimples 245 which are used to increase the effective surface area of die attach area 272. In this manner, the increased effective surface area of die attach area 272 improves the attachment of an integrated die 260 by providing numerous anchor points. The increase in the effective surface area of die attach area 272 created by the presence of dimples 245 also improves the heat transfer capability of die attach area 272.

Figure 2B:
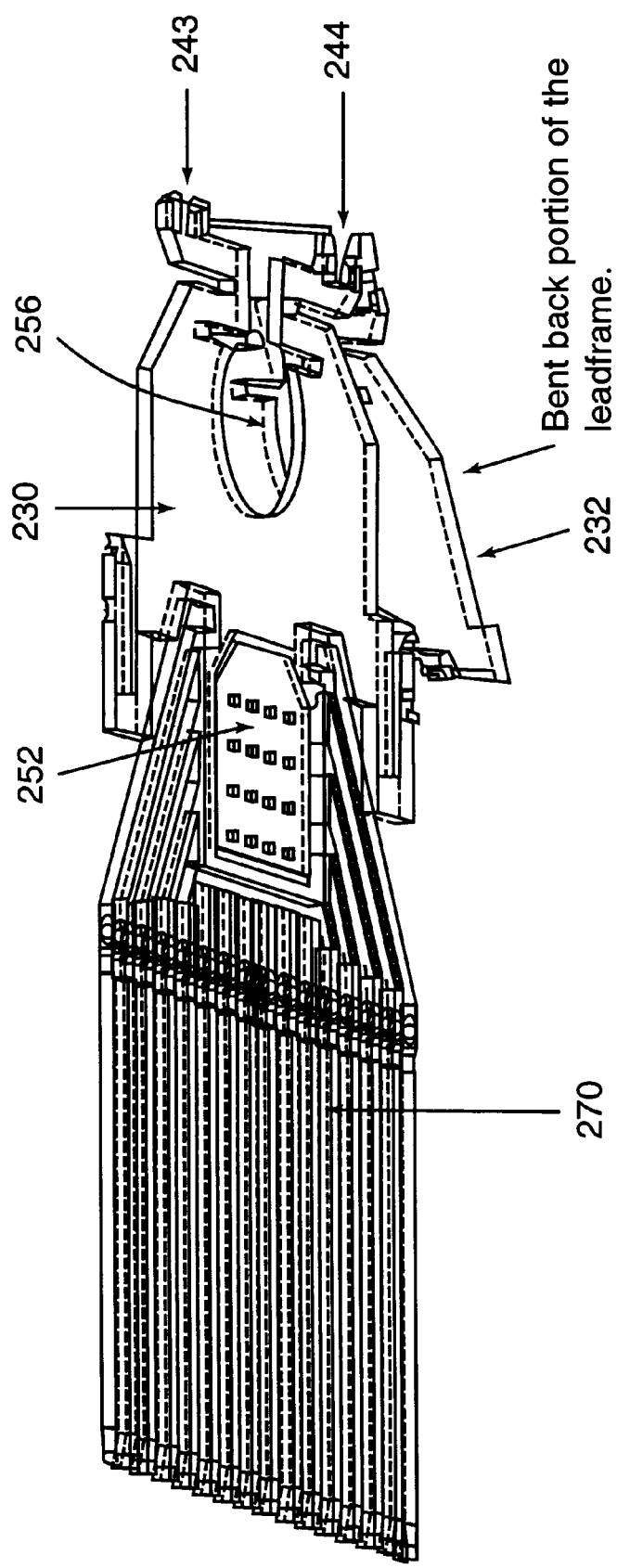
FIG. 2B is a side view of a single gauge lead frame as shown in FIG. 2A with a second support pad bent back upon the first support pad.

Prior to encapsulation, first support pad 232 is detached from lead frame body 210 by severing attachment tabs 246 and 247. A pressing tool then forces support pad 232 to become bent back upon first support pad 230 using attachment tabs 244 and 245 as alignment tools as shown in FIG. 2B. In this manner, second support pad 232 may be properly aligned to first support pad 230 in such a way that support notches 250 and 252 form a single support hole 256 capable of supporting lead frame assembly 220.

In another embodiment, support pad 230 may be downset relative to leads 270 which may reduce the length of wires connecting leads 270 and attached die 260. The downsetting operation may be performed prior to the separation of support pad 232 from lead frame body 210. In yet another embodiment, both support pads 230 and 232 may be downset substantially simultaneously after which support pad 232 may be bent back upon support pad 230. In still another embodiment, the operations of downsetting and bending back may be accomplished in a single operative step.

Referring again to FIG. 2A, lead frame 220 includes a plurality of leads 270 which typically connect an attached semiconductor die 260 to external circuitry (not shown). The semiconductor die, 260, and its associated bond pads 261 is mounted on a die attach area 272 and may be electrically connected to the leads in any conventional manner known in the art. By way of example, the electrical connection to the leads is most commonly accomplished through the use of a plurality of bonding wires which connect associated ones of leads to associated ones of bond pads on die.

According to one embodiment, the lead frame assembly 220 is arranged to encapsulate die, bonding wires, semiconductor device, and a portion of the leads after second support pad 232 has been folded back upon first support pad 230 to form a double thick support pad.

Figure 3:
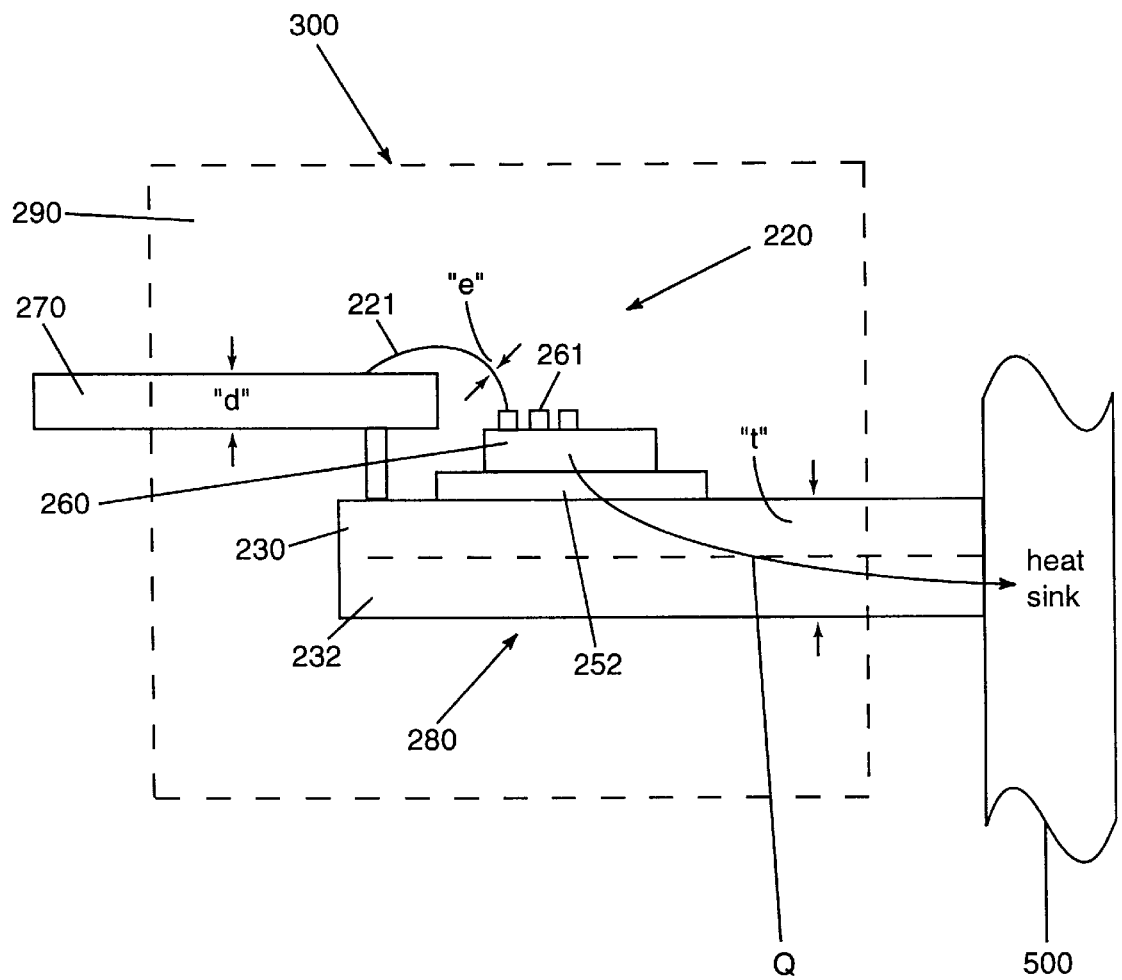
FIG. 3 is a diagrammatic cross sectional view of semiconductor package which includes a semiconductor device mounted to the single gauge lead frame shown in FIG. 2B.

FIG. 3 is a diagrammatic cross sectional view of semiconductor package 300 which includes a semiconductor device 260 mounted to the single gauge lead frame assembly 220 shown in FIG. 2A and FIG. 2B. In the described embodiment, the second support pad 232 has been doubled back upon the first support pad 230 to form a double thick support pad 280. In the present embodiment, encapsulating material 290 encapsulates the die 260, bonding wires 221, and a portion of the leads 270, to form the final form of the semiconductor device package 300.

According to the described embodiment, the double thick support pad 280 is substantially equal to twice the original thickness of the lead frame blank, or since it was formed from a single gauge lead frame blank, approximately twice the thickness of the leads 270. In this embodiment, electrical leads 270 have a thickness "d" in the range of 10–20 mils for lead counts greater than 10 but may be less then 10 mils for lead counts fewer than 10. Generally, the semiconductor die 260 is electrically coupled to leads 270 by way of bonding wires 221 which typically have a diameter "e" in the range of 1–3 mils with a preferred diameter of 1.5 mils. As discussed above, the typically small diameter of bond wire 221 effectively thermally isolates semiconductor die 260 from leads 270. Since most encapsulants such as plastic or ceramic have low heat transfer coefficients, the only effective thermal path from semiconductor die 260 to external heat sink 500 for heat flow Q is through double thick support pad 280 by way of die attach area 272. In order to provide an adequate thermal pathway from die 260 to external heat sink 500 (as well as provide adequate mechanical support for die 260), double thick support pad 280 may typically have a thickness "t" in the range of 20–40 mils with a preferred thickness of 30 mils.

A heat flow Q generated by semiconductor die 260 during operation is transported to an external heat sink 500 by way of die attach area 240 and double thick support pad 280. By doubling the thickness of support pad 280 from what it otherwise would be in a conventional single gauge lead frame by bending back support pad 232 upon support pad 230, the amount of heat Q capable of being transferred from operative semiconductor die 280 and external heat sink 500 is correspondingly increased.

Figure 4:
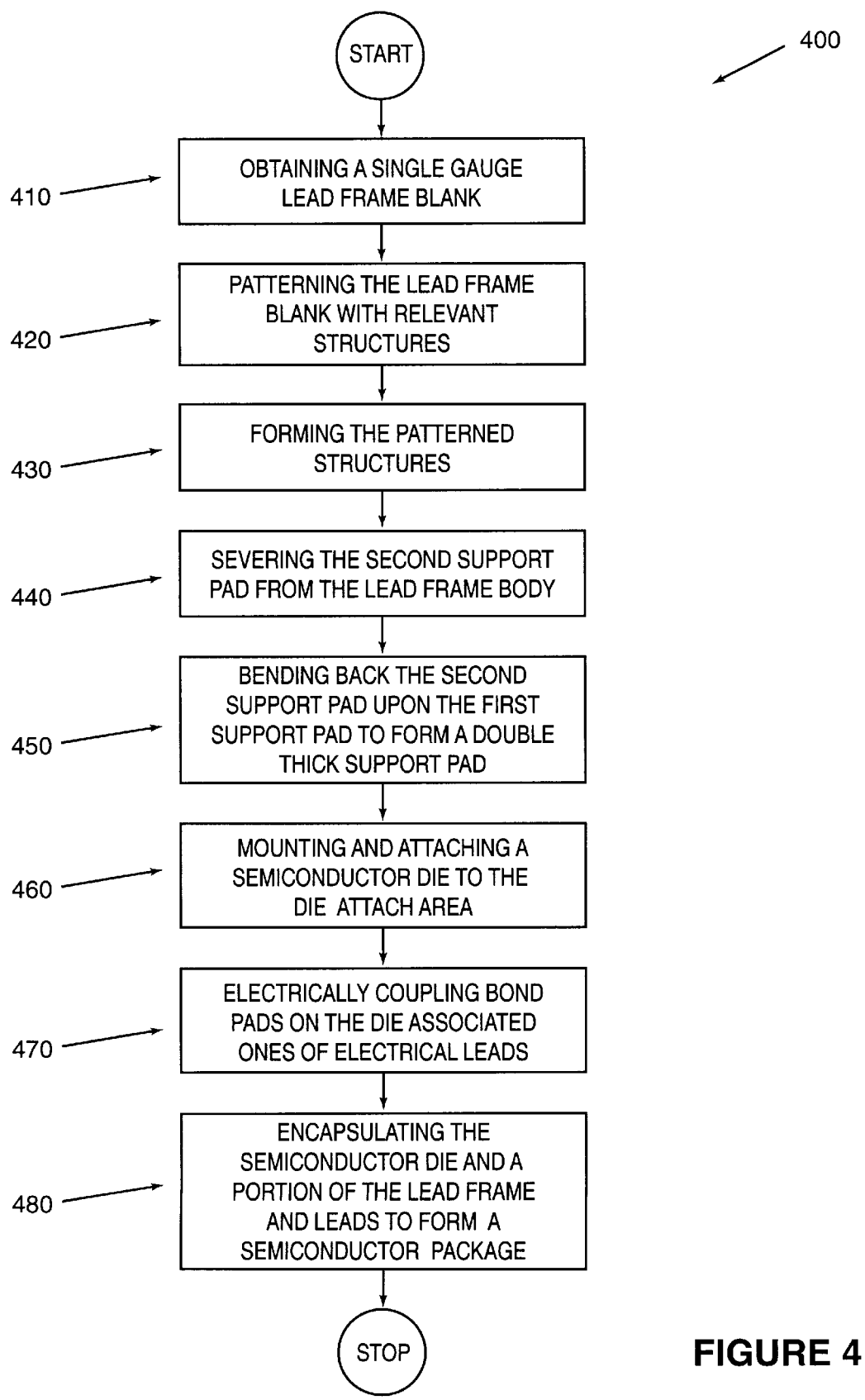
FIG. 4 is a flowchart of the method of producing a semiconductor package in accordance with the present invention.

A method for fabricating a semiconductor device package utilizing a lead frame according to the present invention is now described. Referring to FIG. 4, in one embodiment of the invention, a process 400 for packaging an integrated circuit utilizing a packaging structure that incorporates a lead frame operates as follows. First, a single gauge lead frame blank is obtained 410 which is then patterned 420 with relevant structures such as the first and second support pad, die attach area, and leads to form a plurality of individual lead frames. After the patterning, the features are then formed 430 by any conventional technique used for fabricating lead frames. By way of example, methods such as stamping or etching work well in forming the aforementioned structures for the present invention.

Next, the portion of the second support pad attached to the lead frame body by way of the attachment tabs is severed 440 from the lead frame body. In this manner, the second support pad is free to be bent back 450 upon the first support pad along a line of symmetry between the first and second support pads. After the bending back, a semiconductor die is mounted and attached 460 using conventional techniques well known to those skilled in the art. The die may be additionally supported by double sided polyimide tape.

Next, the attached semiconductor device is electrically coupled 470 to the leads, which is typically done by a plurality of bonding wires that connect associated ones of the bond pads on the die to associated ones of the leads at the associated lead tips. Following the electrical coupling of the bond pads and the electrical leads, an encapsulant then encapsulates 480 the die, the bonding wires, and a portion of the lead frame leaving exposed a portion of the leads to facilitate electrical connection of the semiconductor device to external circuitry. A commonly used encapsulation material is epoxy since it can be easily and cost effectively applied by transfer molding.

One of the advantages of this embodiment is the ability to use relatively inexpensive and easy to manufacture single gauge lead frame blanks and obtain substantially similar thermal and mechanical properties of dual gauge lead frames.

The present invention is not limited to single die configurations. Rather, the single die configuration detailed above is used as an example to illustrate the simplicity of a packaged integrated circuit design according to the present invention and its advantages over conventional single gauge lead frames. In fact, the described invention applies equally well to multi-chip module assemblies.

Although, several embodiments of the present invention have been described in detail, it should be understood that the present invention may be embodied in many other specific forms without departing from the spirit or scope of the invention. Particularly, the bending back the second support pad operation may be performed by other methods other pressing. Additionally, the additional operation of bending back the second support may be combined with the downsetting operation or by other means known by those skilled in the art.

Also, future developments such as laser etching technology or improved techniques in lead frame stamping can be readily incorporated in the advantages of the present invention. The present invention applies to all types of semiconductor device packages using a plastic or resin encapsulating materials and include but are not limited to dual in-line pin, lead die carrier, quad flat pack, and pin grid array package. Therefore, the present examples are to be considered as illustrative and not restrictive, and the invention is not to be limited to the details given, herein, but may be modified with the scope of the appended claims.

I claim:

1. A lead frame, comprising:
   a plurality of leads;
   a first support pad; and
   a second support pad that is integrally formed with the first support pad, the second support pad being substantially a mirror image of the first support pad and bent back upon the first support pad to form a double thick support pad wherein the first support pad includes a first support hole and the second support pad includes a second support hole, wherein the first and the second support holes are used to align the first and the second support pads during the bending back.

2. A lead frame as recited in claim 1 wherein the first support pad includes a die attach area.

3. A lead frame as recited in claim 1, wherein the first support pad and the second support pad are substantially the same size.

4. A packaged semiconductor comprising:
   a lead frame including a plurality of leads, a first support pad, a second support pad that is integrally formed with the first support pad, the second support pad being substantially a mirror image of the first support pad and bent back upon the first support pad to form a double thick support pad, and a die attach area integrally connected to the first support pad, the die attach area having an upper surface and a lower surface, wherein the first support pad includes a first support hole and the second support pad includes a second support hole, wherein the first and the second support holes are used to align the first and the second support pads during the bending back;
   an integrated circuit attached to the upper surface of the die attach area, the integrated circuit having a plurality of bond pads;
   a multiplicity of bonding wires for electrically coupling selected ones of the bond pads to selected ones of the leads in the lead frame; and
   an encapsulating material that encapsulates the integrated circuit, the bonding wires and at least a portion of the leads.

5. A packaged semiconductor as recited in claim 4 wherein the encapsulating material is plastic.

6. A packaged semiconductor as recited in claim 4, wherein the second support pad is held in contact with the first support pad by the encapsulating material.

7. A lead frame as recited in claim 4, wherein the first support pad and the second support pad are substantially the same size.

8. A packaged semiconductor comprising:
   a lead frame including
      a plurality of leads, a first support pad, and a second support pad that is integrally formed with the first support pad, the second support pad being substantially a mirror image of the first support pad and bent back upon the first support pad to form a double thick support pad, wherein the first support pad includes a die attach area, and wherein the first support pad includes a first support hole and the second support pad includes a second support hole, wherein the first and the second support holes are used to align the first and the second support pads during the bending back;
   an integrated circuit attached to the upper surface of the die attach area, the integrated circuit having a plurality of bond pads;
   a multiplicity of bonding wires for electrically coupling selected ones of the bond pads to selected ones of the leads in the lead frame; and
   an encapsulating material that encapsulates the integrated circuit, the bonding wires and at least a portion of the leads.

9. A packaged semiconductor as recited in claim 8 wherein the encapsulating material is plastic.

10. A packaged semiconductor as recited in claim 8, wherein the second support pad is held in contact with the first support pad by the encapsulating material.

11. A lead frame as recited in claim 8, wherein the first support pad and the second support pads are substantially the same size.

* * * * *